(12) United States Patent
Sasaki et al.

(10) Patent No.: US 11,454,660 B2
(45) Date of Patent: Sep. 27, 2022

(54) MEASUREMENT DEVICE FOR MEASURING AN ELECTRICAL CHARACTERISTIC OF A COMPONENT

(71) Applicant: FUJI CORPORATION, Chiryu (JP)

(72) Inventors: Toshihiko Sasaki, Toyoake (JP); Toshiyuki Sawada, Toyota (JP)

(73) Assignee: FUJI CORPORATION, Chiryu (JP)

( * ) Notice: Subject to any disclaimer, the term of this patent is extended or adjusted under 35 U.S.C. 154(b) by 6 days.

(21) Appl. No.: 17/261,465

(22) PCT Filed: Jul. 20, 2018

(86) PCT No.: PCT/JP2018/027272
§ 371 (c)(1),
(2) Date: Jan. 19, 2021

(87) PCT Pub. No.: WO2020/017019
PCT Pub. Date: Jan. 23, 2020

(65) Prior Publication Data
US 2021/0278449 A1 Sep. 9, 2021

(51) Int. Cl.
*G01R 27/02* (2006.01)
*H05K 13/08* (2006.01)

(52) U.S. Cl.
CPC ........... *G01R 27/02* (2013.01); *H05K 13/082* (2018.08)

(58) Field of Classification Search
CPC .............................. G01R 27/02; H05K 13/082
See application file for complete search history.

(56) References Cited

U.S. PATENT DOCUMENTS 6,079,096 A * 6/2000 Hata ................... H05K 13/0417
29/832
2018/0203041 A1 7/2018 Sawada et al.

FOREIGN PATENT DOCUMENTS

| JP | 2003337153 A | * | 11/2003 |
| JP | 2005-101342 A | | 4/2005 |
| JP | 2017-26325 A | | 2/2017 |
| WO | WO 2017/009987 A1 | | 1/2017 |

OTHER PUBLICATIONS

International Search Report dated Oct. 16, 2018 in PCT/JP2018/027272 filed on July 20, 2018, 2 pages.

* cited by examiner

*Primary Examiner* — Walter L Lindsay, Jr.
*Assistant Examiner* — Milton Gonzalez
(74) *Attorney, Agent, or Firm* — Oblon, McClelland, Maier & Neustadt, L.L.P.

(57) ABSTRACT

A measurement device to automatically measure an electrical characteristic of a component is mounted on a mounter for mounting a component on a circuit board. The measurement device includes a main body, a loading stand on which a component is placed, a pair of measuring elements provided in such a manner as to move towards and away from each other, and a loading stand moving device for moving the loading stand. The loading stand moving device includes a guide rail provided on the main body, and the loading stand is held movably onto the guide rail. This configuration enables an electrical charge stored in a component held onto the loading stand and an electrical charge stored in the loading stand to be removed well by way of the guide rail and the main body. As a result, an electrical characteristic held by the component can be measured stably.

4 Claims, 8 Drawing Sheets

MEASUREMENT DEVICE FOR MEASURING AN ELECTRICAL CHARACTERISTIC OF A COMPONENT

TECHNICAL FIELD

The present disclosure relates to a measurement device for measuring an electrical characteristic of a component to be mounted on a circuit board.

BACKGROUND ART

Patent Literature 1 describes a measurement device to be mounted on a mounter for mounting a component supplied by a component supply device on a circuit board to measure an electrical characteristic of a component and including a main body held onto a base section, a loading stand on which a component is placed, a stationary element and a movable element, which are provided so as to move towards and away from each other, and a loading stand moving device for moving the loading stand. In the measurement device described in Patent Literature 1, the loading stand moving device includes an air cylinder and a pair of guide rods provided between a movable element holder for holding the movable element and the loading stand. The loading stand is held movably onto the pair of guide rods, so that the loading stand is caused to move along the guide rods as the air cylinder operates.

Patent Literature

Patent Literature 1: JP-A-2017-26325

BRIEF SUMMARY

Technical Problem

A problem to be solved by the present disclosure is an improvement in the measurement device, and an object thereof is to enable a stable measurement of an electrical characteristic of a component.

Solution to Problem and Advantageous Effects

According to the present disclosure, there is provided a measurement device including a main body, a loading stand on which a component is mounted, a pair of measuring elements provided in such a manner as to move towards and away from each other, and a loading stand moving device for moving the loading stand, wherein the loading stand moving device includes a guide rail provided on the main body, and the loading stand is held movably onto the guide rail. This enables an electrical charge stored in a component held onto the loading stand and an electrical charge stored in the loading stand to be removed well by way of the guide rail and the main body. As a result, an electrical characteristic held by the component can be measured stably.

BRIEF DESCRIPTION OF DRAWINGS

FIG. 10A is a diagram showing an initial state. FIG. 10B is a diagram showing a clamping state. FIG. 10C is a diagram showing a measurement state. FIG. 10D is a diagram showing a discard state.

DESCRIPTION OF EMBODIMENT

Hereinafter, a mounter including a measurement device, which constitutes an embodiment of the present disclosure, will be described in detail based on drawings.

EMBODIMENT

Figure 1:
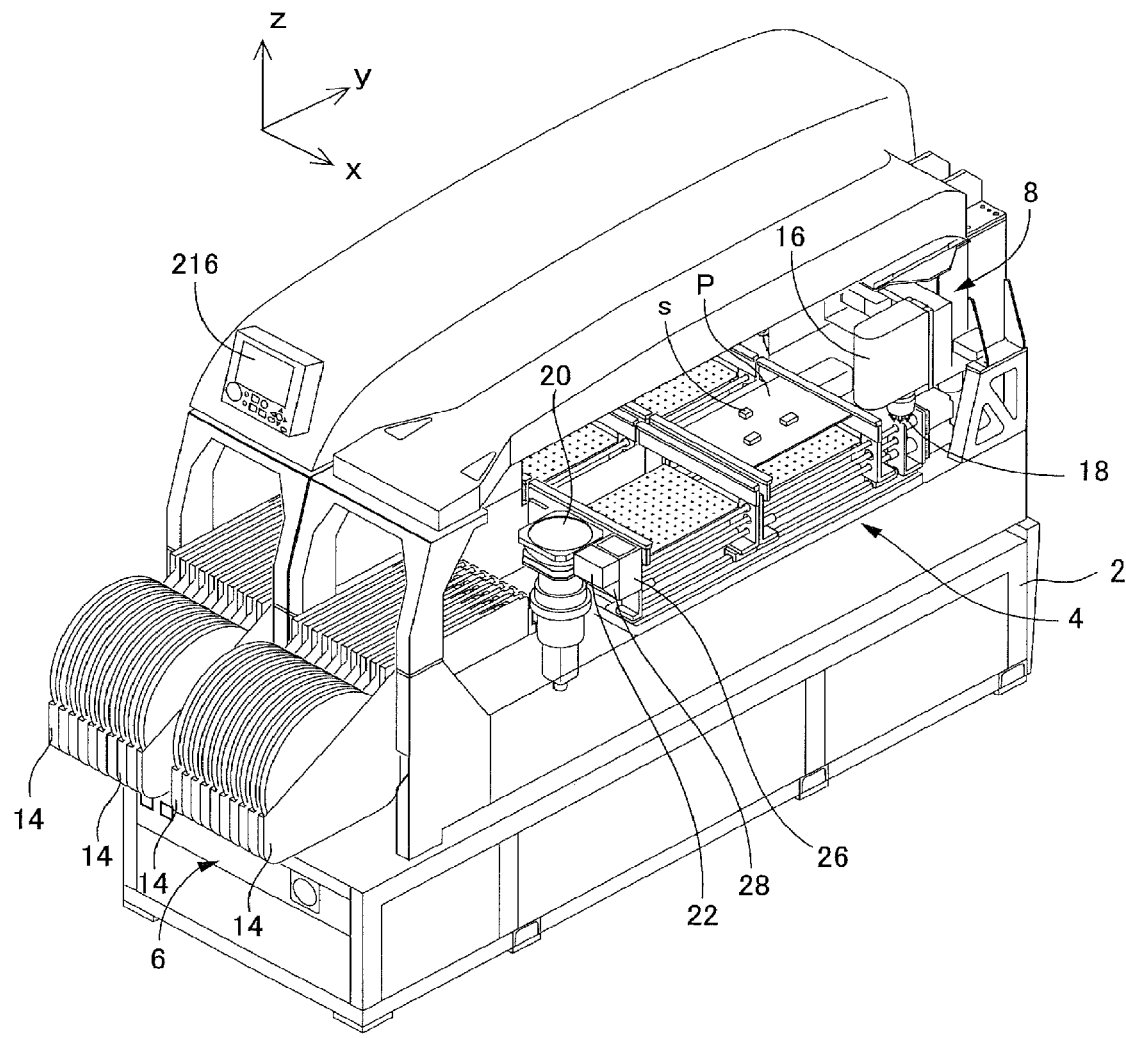
FIG. 1 is a perspective view of a mounter including a measurement device according to an embodiment of the present disclosure.

A mounter shown in FIG. 1 is intended to mount a component on a circuit board and includes main body 2, circuit board conveyance and holding device 4, component supply device 6, head moving device 8, and the like. Circuit board conveyance and holding device 4 is intended to convey and hold circuit board P (hereinafter, referred simply to as board P) in a horizontal posture, and in FIG. 1, a conveyance direction of board P is referred to as an x-direction, a width direction of board P is referred to as a y-direction, and a thickness direction of board P is referred to as a z-direction. The y-direction and z-direction denote a front-rear direction and an up-down direction of the mounter, respectively. These x-direction, y-direction, and z-direction are orthogonal to one another. Component supply device 6 is intended to supply an electronic component (hereinafter, referred simply to as a component) S to be mounted on board P and includes multiple tape feeders 14 and the like. Head moving device 8 is intended to hold and move mounting head 16 in the x-direction, y-direction, and z-direction, and mounting head 16 has suction nozzle 18 configured to pick up and hold component S.

Reference numeral 20 denotes a camera. Camera 20 is intended to image component S held by suction nozzle 18, and it is determined whether component S is a component scheduled to be mounted on circuit board P based on an image captured by camera 20. Reference numeral 22 denotes a measurement device. Measurement device 22 is intended to measure an electrical characteristic of component S. As an electrical characteristic of component S, L (inductance), C (capacitance), R (resistance), Z' (impedance), and the like correspond thereto, and one or more of these electrical characteristics are measured by measurement device 22.

Measurement device 22 is provided on a main body of circuit board conveyance and holding device 4 via waste box 26. Discard passage 28 is provided between waste box 26 and measurement device 22, so that component S whose electrical characteristic is measured is discarded to be accommodated in waste box 26 by way of discard passage 28. Measurement device 22 is provided on waste box 26 in such a manner as to be adjusted in relation to its height.

As shown in FIGS. 2 to 6, measurement device 22 includes (i) main body 30, (ii) loading stand 32 on which component S is placed, (iii) pair of measuring elements 37 configured of stationary element 34 and movable element 36, (iv) loading stand moving device 40 for moving loading stand 32, (v) movable element moving device 41 for moving movable element 36 towards and away from stationary element 34, (vi) electrical characteristic measurement section 42 (refer to FIG. 8) as an electrical characteristic acquisition section, and the like. In the present embodiment, component S has electrodes at both end portions and can be gripped by pair of measuring elements 37, and component S can take the form of a square chip.

Measurement device 22 can be attached to the main body of circuit board conveyance and holding device 4 in such a manner, for example, that the direction in which movable element 36 moves towards and away from stationary element 34 constitutes the y-direction, while a direction orthogonal to the direction in which the former moves towards and away from the latter constitutes the x-direction. A movement of movable element 36 towards stationary element 34 in the y-direction is referred to as advance, while a movement of movable element 36 away from stationary element 34 in the y-direction is referred to as retreat. The same will apply to similar movements of loading stand 32.

Main body 30 includes lifting and lowering section 30a, which is attached to waste box 26 in such a manner as to be lifted up and down or lowered, loading stand 32 described above, holding section 30b for holding pair of measuring elements 37 and the like, base section 30d to which ground wire 30c is connected, and the like. These lifting and lowering section 30a, holding section 30b, and base section 30d are attached together with a fastening member such as a bolt in such a state that they are in surface contact with one another. In addition, lifting and lowering section 30a, holding section 30b, base section 30d, and the fastening member are all made of a metallic material and are provided in such a state that they electrically communicate with one another. Here, the metallic material is referred to as a material whose volume resistivity ($\Omega \cdot m$) is $a \times 10^{-6}$ or smaller ($10 > a \geq 1$), and for example, iron, stainless steel, nickel, copper, aluminum, and the like can be used for the metallic material.

Hereinafter, when metallic materials are referred to in the present embodiment, the same will apply. Through hole 31 (refer to FIG. 5) is provided in holding section 30b in such a manner as to communicate with discard passage 28.

Loading stand 32 includes component placement section 44 and placement section holder 46 for holding component placement section 44. V-groove 44c is formed on component placement section 44, so that component S is placed therein. Component placement section 44 is brought into abutment with placement section holder 46 and is fixed in place by fastening section 47.

Figure 3:
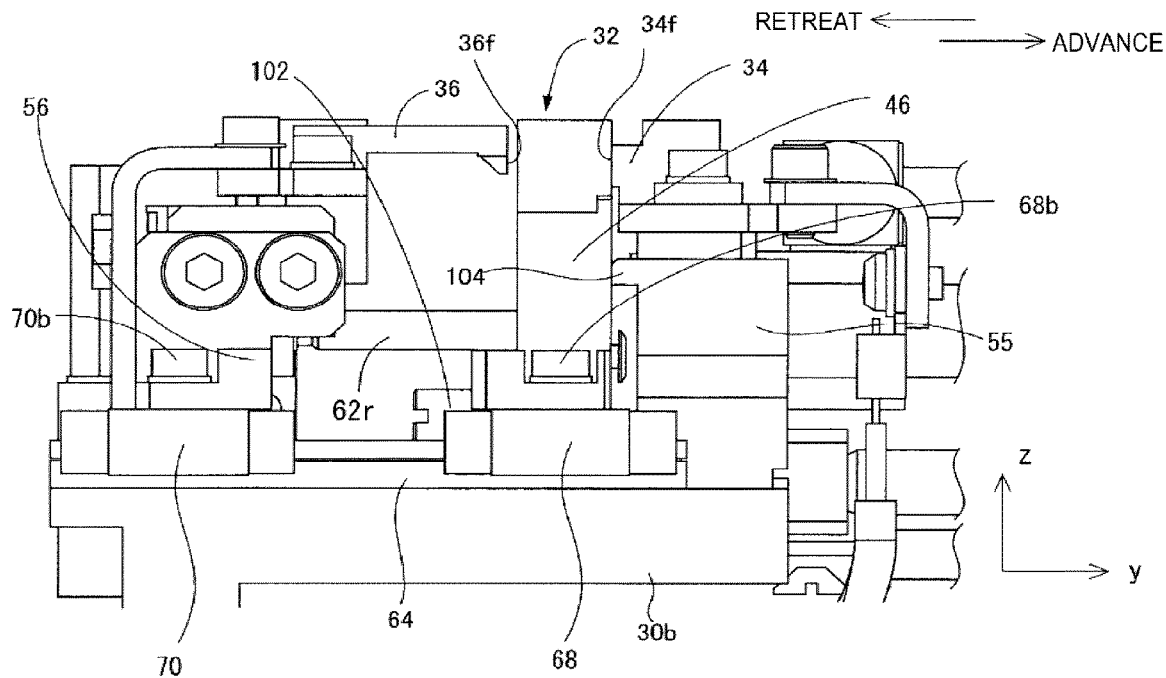
FIG. 3 is a side view of the main section of the measurement device.

Stationary element 34 and movable element 36 have, as shown in FIG. 3, opposing surfaces 34f, 36f, respectively, which lie opposite to each other, and component S is gripped in place by pair of opposing surfaces 34f, 36f. Stationary element 34 is held by stationary element holder 55, and stationary element holder 55 is fixed to main body 30 (holding section 30b). Movable element 36 is held onto movable element holder 56 in such a manner as to move together therewith, and movable element holder 56 is provided in such a manner as to move in the y-direction with respect to main body 30. As a result, movable element 36 is allowed to move towards and away from stationary element 34. Stationary element 34 and movable element 36 are connected individually to electrical characteristic measurement section 42 (refer to FIG. 8) via a copper wire.

Figure 4:
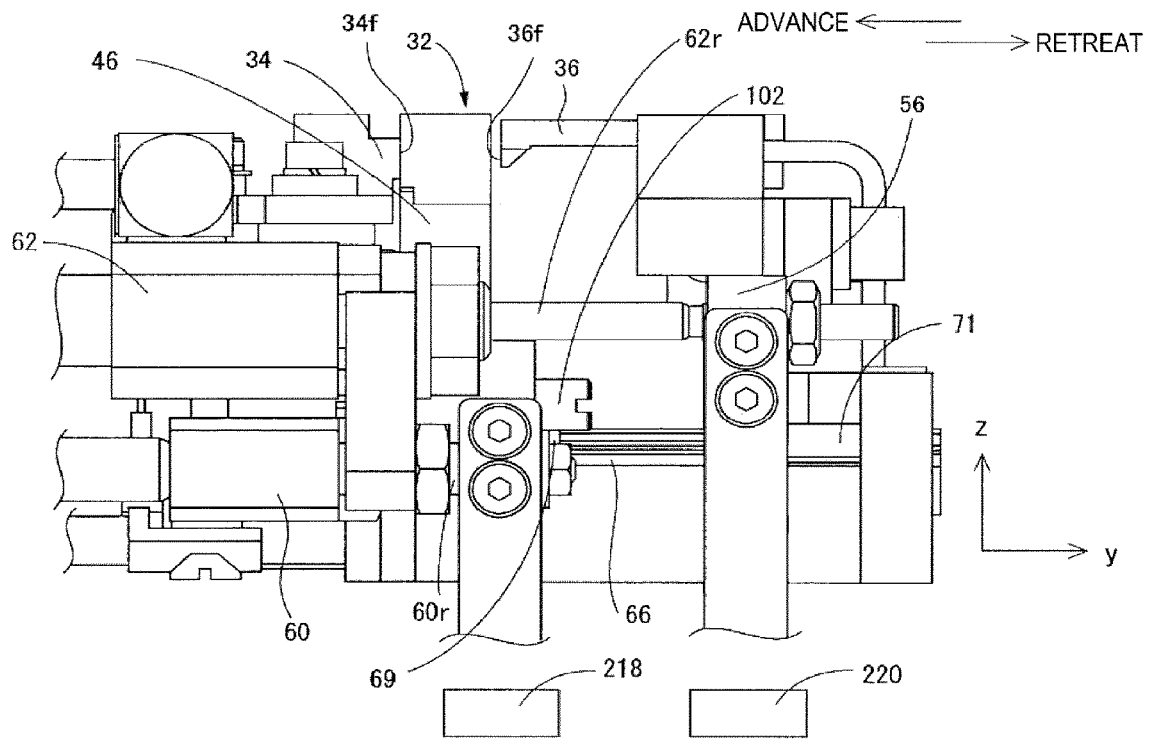
FIG. 4 is another side view of the main section of the measurement device.
Figure 7:
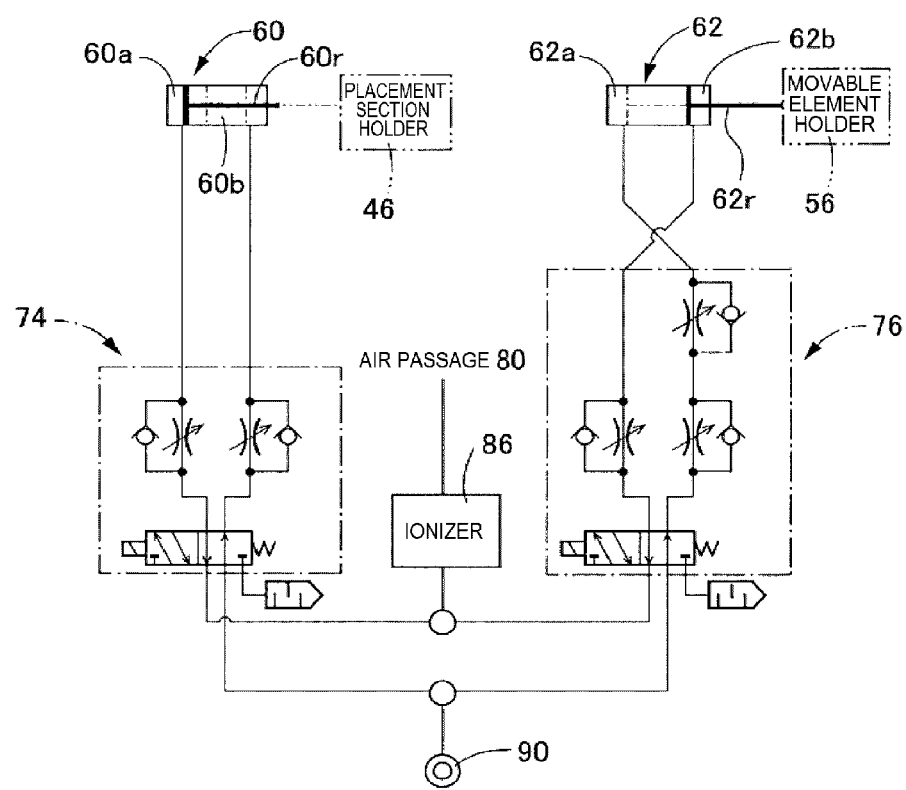
FIG. 7 is a diagram of an air circuit contained in the measurement device.

Loading stand moving device 40 and movable element moving device 41 include, respectively, air cylinders 60, 62 as driving sources, as shown in FIG. 7, pair of guide rails 64, 66 provided on holding section 30b, as shown in FIGS. 3 and 4, pairs of loading stand sliders 68, 69 and movable element sliders 70, 71, which are brought into movable engagement with guide rails 64, 66, respectively, electromagnetic valves 74, 76, and the like.

Figure 6:
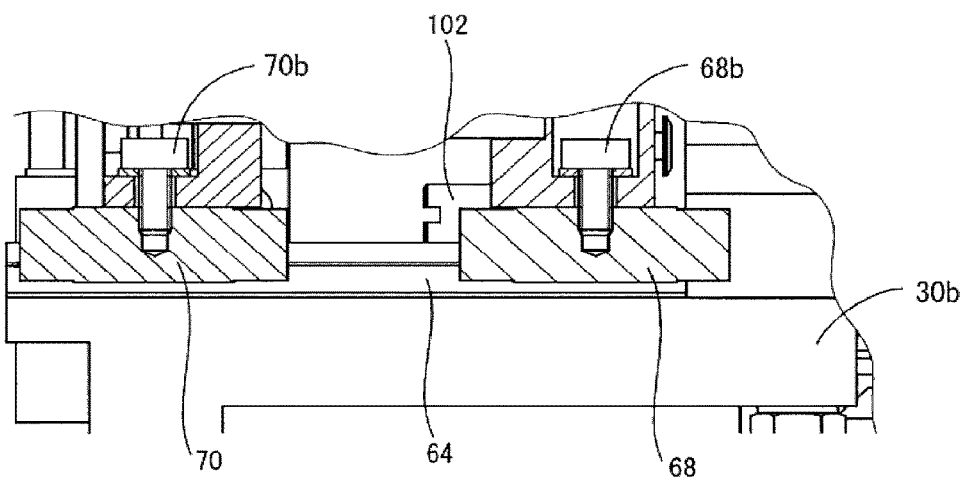
FIG. 6 is another sectional view of the main section of the measurement device.

Pair of guide rails 64, 66 are fixed in place with bolt 64b (refer to FIG. 2) in such a state of extending in the y-direction (the direction in which stationary element 34 and movable element 36 move towards and away from each other), while being separated from each other in the x-direction, and being in surface contact with holding section 30b. As shown in FIG. 6, placement section holder 46 is fixed to pair of loading stand sliders 68, 69 with bolts 68b, 69b (only bolt 68b shown), respectively, in such a state that placement section holder 46 is kept in surface contact with both the relevant loading stand sliders, and movable element holder 56 is fixed to pair of movable element sliders 70, 71 with bolts 70b, 71b (only bolt 70b shown), respectively, in such a state that movable element holder 56 is kept in surface contact with both the relevant movable element sliders. In addition, piston rod 60r of air cylinder 60 is attached to placement section holder 46, and piston rod 62r of air cylinder 62 is attached to movable element holder 56. Air cylinders 60, 62 are provided in such an orientation that piston rods 60r, 62r extend in the y-direction.

Pair of guide rails 64, 66, bolt 64b and the like, pair of loading stand sliders 68, 69, movable element sliders 70, 71, bolts 68b, 69b, 70b, 71b are all made of a metallic material. Further, component placement section 44, placement section holder 46, movable element 36, movable element holder 56, and the like are also made of a metallic material. Component placement section 44, movable element 36, and holding section 30b are coupled together through contacts of the members made of the metallic material. As a result, component placement section 44, movable element 36, and holding section 30b are kept in a good electrically communicable state, whether loading stand 32 and movable element holder 56 are in a halt state or a moving state.

On the other hand, component S may be contact charged as a result of component S being brought into contact with a tape or component S being brought into contact with suction nozzle 18, or the like. In addition, loading stand 32 and movable element holder 56 may be friction charged as a result of being brought into friction contact with guide rails 64, 66. Thus, in the case that component S, loading stand 32, and movable element holder 56 are so charged to have an extra electric charge, having such an extra electric charge makes it difficult to measure an electrical characteristic of a component stably. In contrast with the case mentioned above, with the present measurement device, since loading stand 32, movable element holder 56 (movable element 36), and holding section 30b are kept in the electrically communicable state whether they are in the halt state or the moving state, the extra electric charge held by component S and the electric charges held by loading stand 32, movable element 36, movable element holder 56, and the like can be eliminated at all times via loading stand sliders 68, 69, movable element sliders 70, 71, guide rails 64, 66, holding section 30b, lifting and lowering section 30a, and base section 30d. For example, although static electricity is generated as a result of loading stand 32 and movable element holder 56 being brought into fiction contact with guide rails 64, 66 when loading stand 32 and movable element holder 56 move, electric charge generated by the static electricity can be eliminated without any delay.

Figure 5:
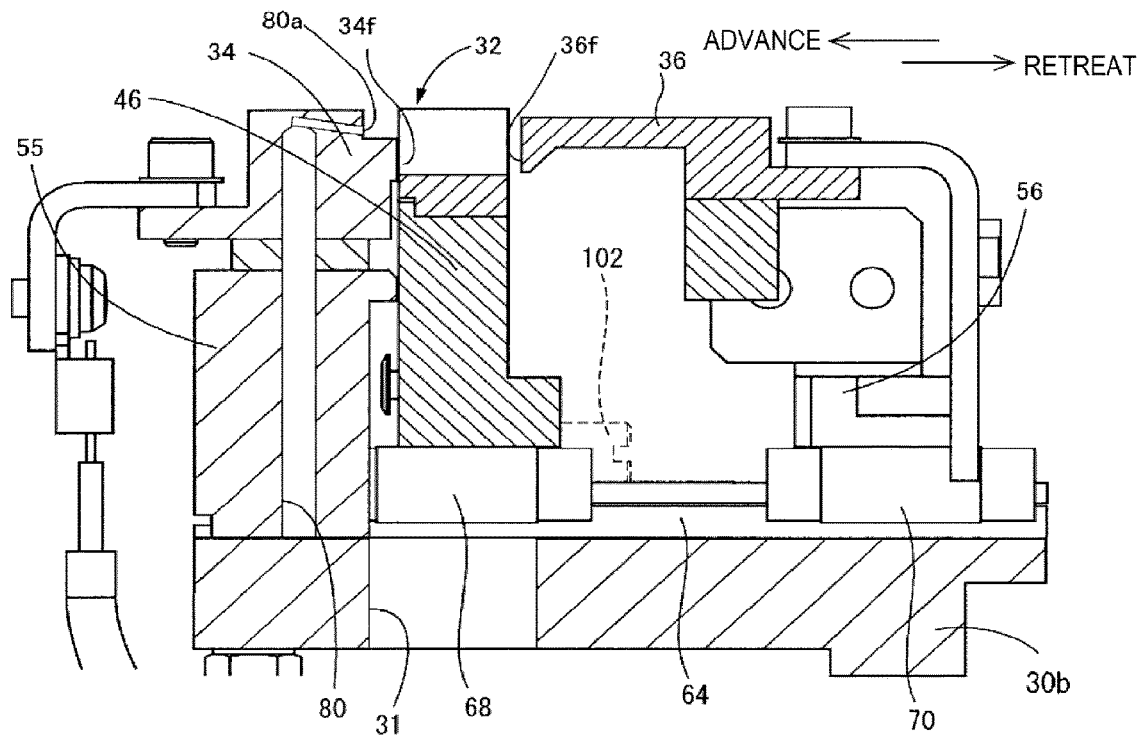
FIG. 5 is a sectional view of the main section of the measurement device.

On the other hand, as shown in FIG. 5, air passage 80 is formed on a stationary element side member (for example, one or more of an upper portion of stationary element 34, stationary element holder 55, and holding section 30b) in such a manner as to be connected to air cylinders 60, 62. Opening 80a in air passage 80 is formed in such a manner as to face opposing surface 36f of movable element 36. In addition, ionizer 86 (refer to FIG. 7) is connected to air passage 80. Ionizer 86 is intended to ionize air by generating a corona discharge.

As shown in FIG. 7, electromagnetic valve device 74 is provided between two air chambers 60a, 60b of air cylinder 60 on one side and air source 90, air passage 80, and a filter (the atmosphere) on the other side. Movement or the like of placement section holder 46 (loading stand 32) is controlled by controlling electromagnetic valve device 74.

Air source 90, air passage 80, and the filter (the atmosphere) are connected to air chambers 62a, 62b of air cylinder 62 by way of electromagnetic valve device 76. Movement or the like of movable element holder 56 (movable element 36) is controlled by controlling electromagnetic valve device 76. In addition, when loading stand 32 advances and when movable element 36 retreats, air is supplied from air cylinders 60, 62 into air passage 80 and is then supplied to opposing surface 36f of movable element 36.

Figure 2:
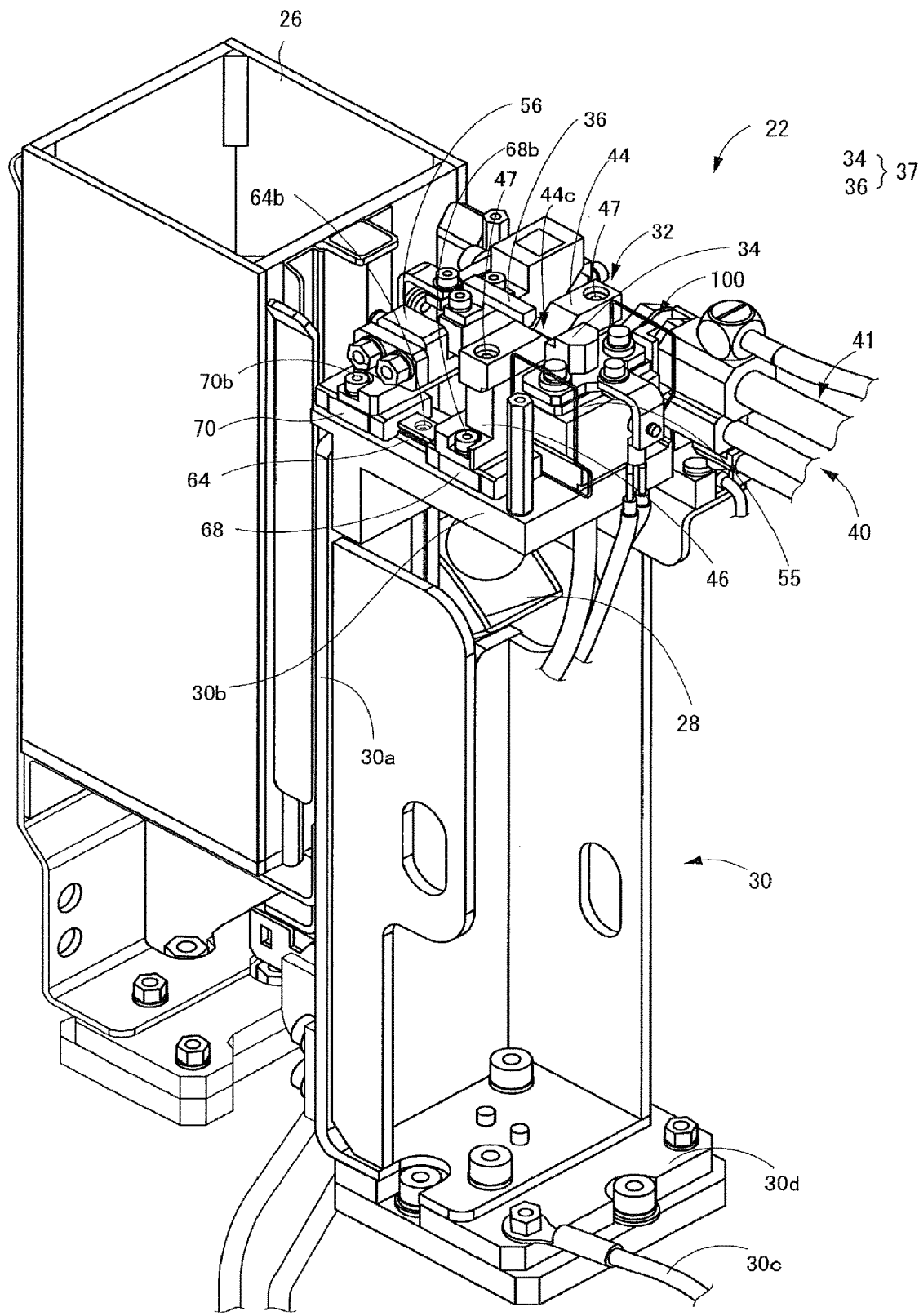
FIG. 2 is a perspective view of a main section of the measurement device.

Further, cover section 100 is attached to loading stand 32 as shown in FIG. 2. Cover section 100 functions not only to prevent the dispersion of air but also to prevent the scattering of components S which are dropped by air jetted. In FIG. 2, although cover section 100 is illustrated as a transparent member, cover section 100 is not limited to such a transparent member.

In addition, as shown in FIG. 3, stopper 102 is provided at a portion of loading stand 32 which lies on a side facing movable element holder 56. An approach limit between movable element holder 56 and loading stand 32 is regulated by stopper 102. Stopper 104 is provided on stationary element holder 55. An approach limit between stationary element 34 and loading stand 32 is regulated by stopper 104.

Figure 8:
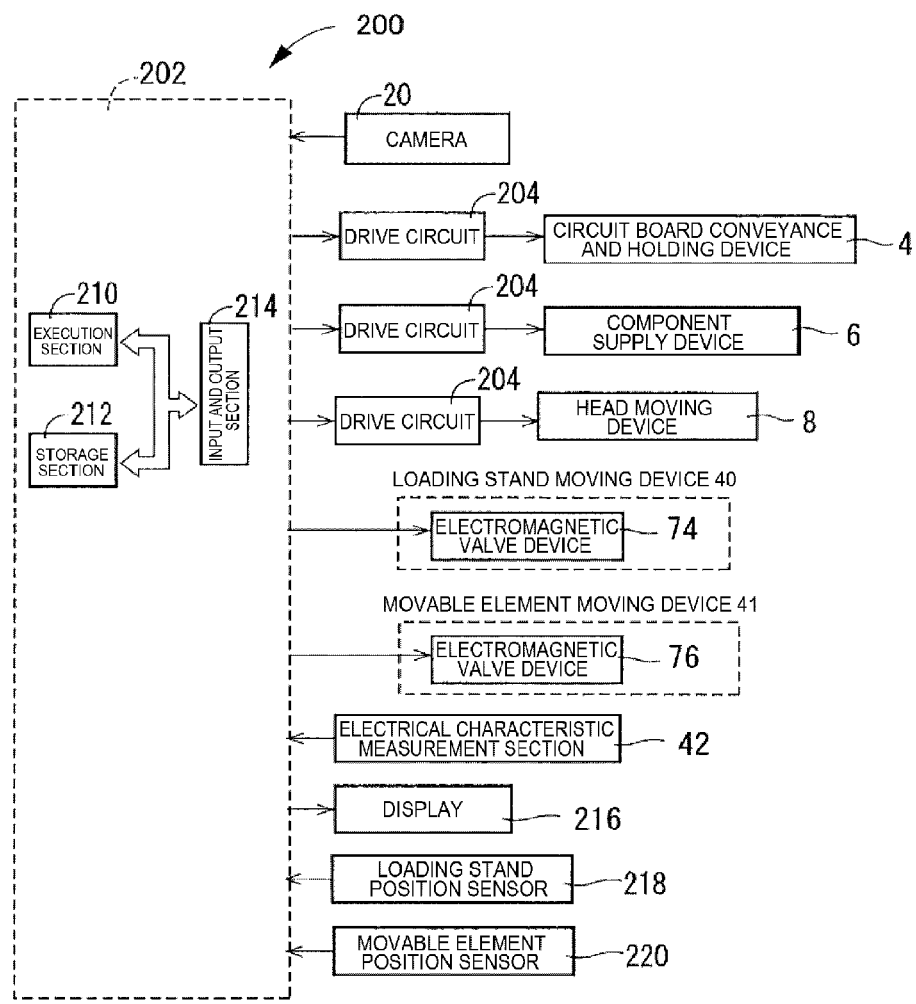
FIG. 8 is a block diagram representing conceptionally a periphery of a control device of the measurement device.

The mounter includes control device 200. Control device 200 includes, as shown in FIG. 8, controller 202, which is configured mainly of a computer, and multiple drive circuits 204. Controller 202 includes execution section 210, storage section 212, input and output section 214, and the like, and circuit board conveyance and holding device 4, component supply device 6, and head moving device 8 are connected individually to input and output section 214 via corresponding drive circuits 204, while respective electromagnetic valve devices 74, 76 of loading stand moving device 40 and movable element moving device 41 are also connected to input and output section 214. Additionally, camera 20, electrical characteristic measurement section 42, display 216, loading stand position sensor 218, movable element position sensor 220, and the like are also connected to input and output section 214.

Figure 9:
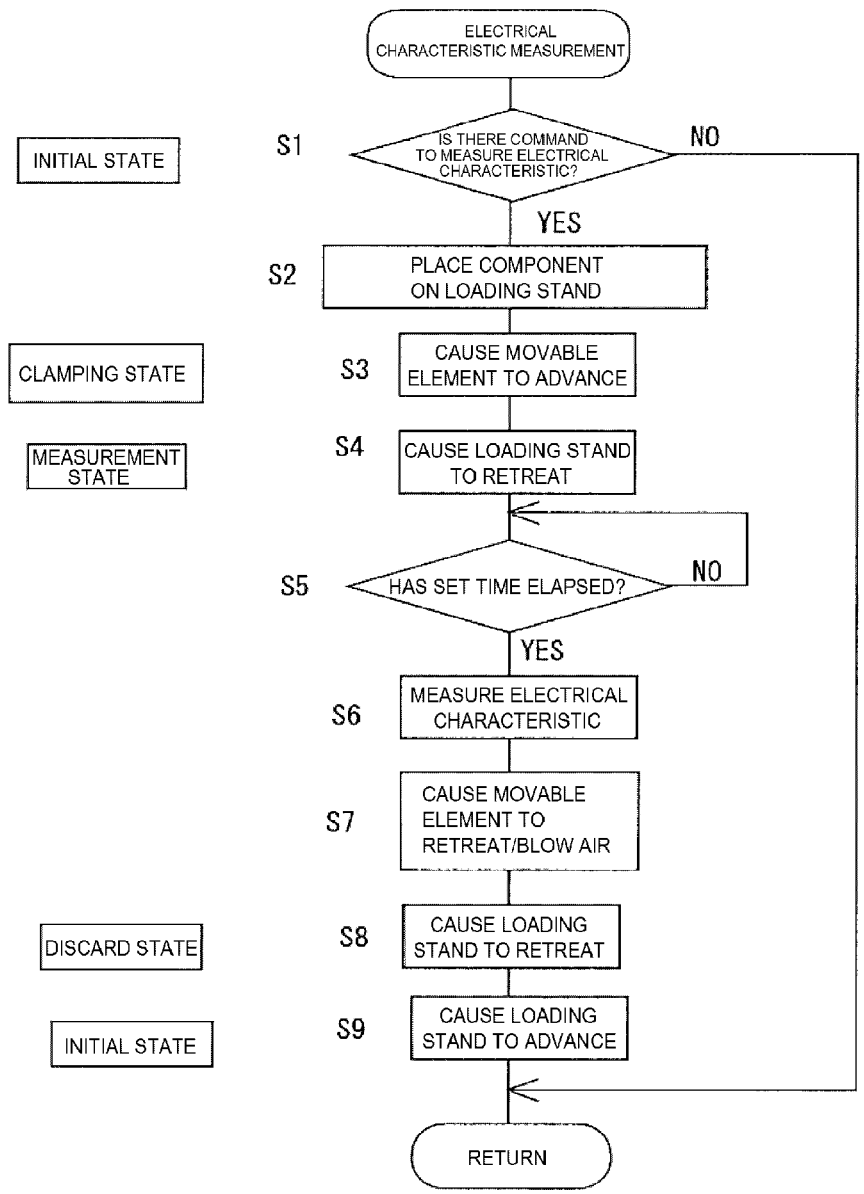
FIG. 9 is a flowchart representing an electrical characteristic measurement program stored in a storage section of the control device.

An electrical characteristic of component S is measured by executing an electrical characteristic measurement program represented by a flowchart shown in FIG. 9. Electromagnetic valve devices 74, 76 are controlled based on output signals of loading stand position sensor 218 and movable element position sensor 220, and the like. In addition, a result of a measurement of an electrical characteristic can be displayed on display 216. Measurement device 22 is always in an initial state shown in FIG. 10A. Movable element 36 is in a retreat end position, and loading stand 32 is in an advanced end position, that is, in a position where loading stand 32 is in abutment with stopper 104.

In Step 1 (hereinafter, referred to simply as S1. The same will apply to other steps), it is determined whether a command to measure an electrical characteristic of component S has been issued. For example, in the case that a command to measure an electrical characteristic of component S is issued for a case in which a setup changeover is carried out or the like, a determination made in S1 becomes YES, and mounting head 16 is caused to move in S2.

Component S is held and moved to be placed in V groove 44c by suction nozzle 18.

Figure 10C:
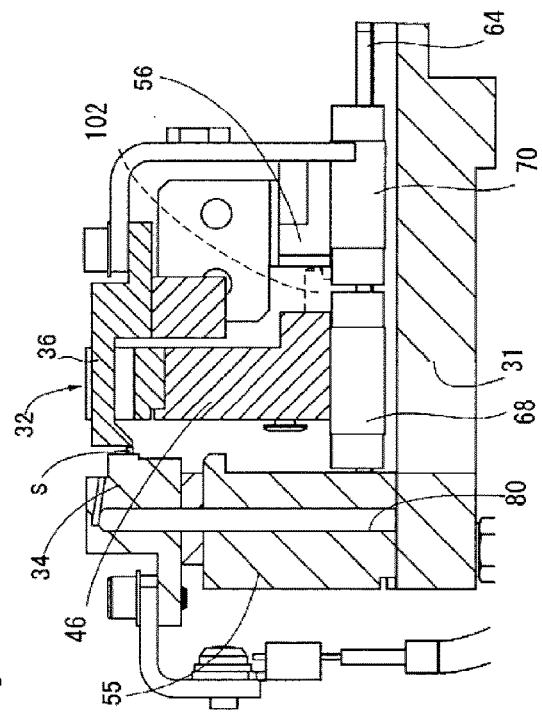
FIG. 10A to FIG. 10D show operation diagrams in a case in which an electrical characteristic of a component is obtained in the measurement device.
Figure 10D:
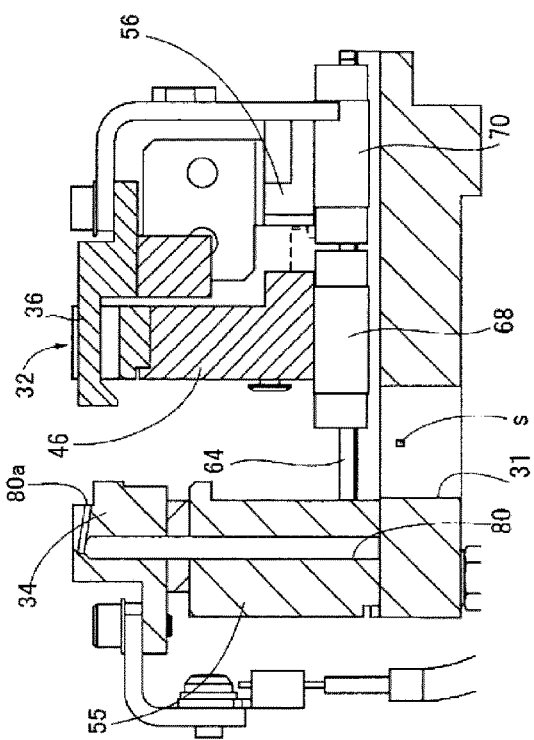
Figure 10A:
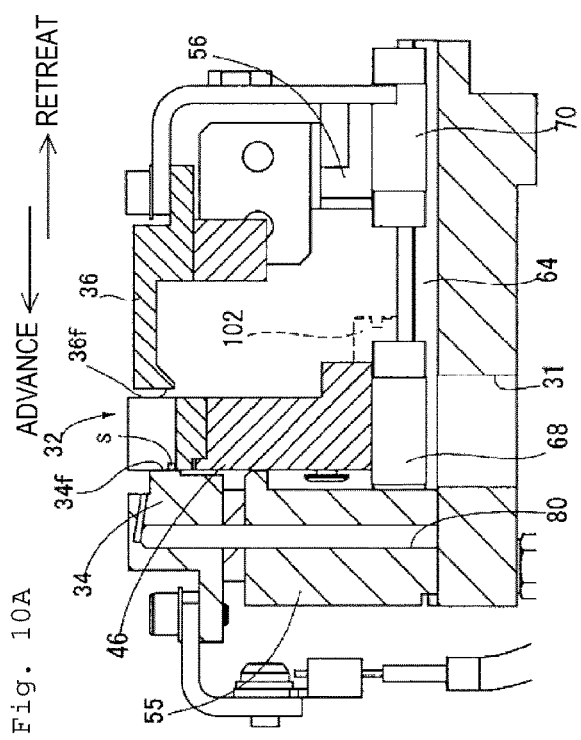
Figure 10B:
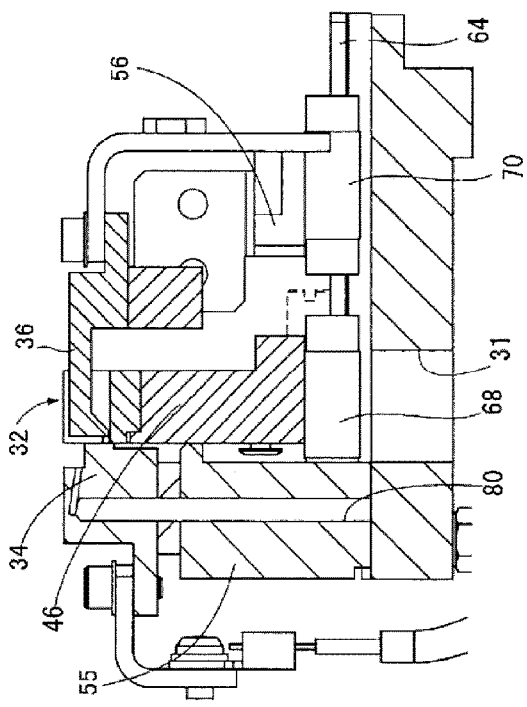

In S3, movable element 36 is caused to advance by controlling electromagnetic valve device 76, whereby component S is clamped by movable element 36 and stationary element 34 as shown in FIG. 10B. This state of measurement device 22 is referred to as a clamping state. In S4, as shown in FIG. 10C, loading stand 32 is caused to retreat until loading stand 34 is brought into abutment with stopper 102 by controlling electromagnetic valve device 74. Loading stand 32 reaches a position where loading stand 32 is spaced apart from component S and pair of measuring elements 37. This state of measurement device 22 is referred to as a measurement state.

In S5, a neutralizing time, which is a set time, is waited for to elapse from a time when component S is placed in V groove 44c. The neutralizing time is a time during which static electricity charged in component S is eliminated. When the elapsing time reaches the neutralizing time, a determination made in S5 becomes YES, and an electrical characteristic of component S is measured in S6. Then, after the measurement of an electrical characteristic of component S is completed, in S7, movable element 36 is caused to retreat, whereby component S gripped between movable element 36 and stationary element 34 is released. In addition, as movable element 36 so retreats, air is supplied obliquely from above to opposing surface 36f of movable element 36 from opening 80a. As a result, component S can be caused to fall well from opposing surface 36f.

In S8, as shown in FIG. 10D, loading stand 32 is caused to retreat. Since a space defined between movable element 36 and stationary element 34 is caused to communicate with discard passage 28, component S can be discarded into waste box 26. This state of measurement device 22 is referred to as a discard state. Then, after loading stand 32 is caused to retreat until loading stand 32 is brought into abutment with stopper 102, in S9, loading stand 32 is caused to advance to be positioned between pair of opposing surfaces 34f, 36f. A space is defined above V groove 44c, so that component S can be placed therein, and measurement device 22 is restored to the initial state shown in FIG. 10A. Further, since air containing ions is supplied to opposing surface 36f of movable element 36 as loading stand 32 advances, opposing surface 36f can also be neutralized.

Thus, as has been described heretofore, with the present embodiment, component S is neutralized well, and additionally, loading stand 32, movable element 36, and the like are also neutralized well. In particular, loading stand 32 and movable element 36 can be neutralized whether loading stand 32 and movable element 36 (movable element holder 56) are in the halt state or in the moving state. This enables a stable measurement of an electrical characteristic of component S. Even with component S whose impedance is small, the impedance of component S in question can be measured with good accuracy. In addition, ground wires connecting holding section 30*b* with lifting and lowering section 30*a* and base section 30*d*, and the like are rendered unessential, thereby making it possible to reduce the number of components of measurement device 22.

Further, since movable element holder 56 and placement section holder 46 are held onto the same guide rails 64, 66, the number of components is reduced accordingly, thereby making it possible to suppress an increase in costs. However, the present disclosure does not exclude a provision of guide rails for exclusive use for movable element holder 56 and placement section holder 46 individually.

Furthermore, in the present embodiment described heretofore, although the operation of measurement device 22 is controlled by control device 200 provided on the mounter, a configuration can be adopted in which a control device is provided to be used exclusively by measurement device 22, so that loading stand 32 and movable element 36 are caused to move by the control device provided exclusively for measurement device 22. In any case, a section for storing S4, 8, and 9 of the flowchart shown in FIG. 9, a section for executing those steps, and the like make up a loading stand movement control section, and a section for storing S3 and 7, a section for executing those steps, and the like make up a movable element movement control section.

Thus, in addition to the mode described in the embodiment, the present disclosure can be carried out in various modes that are modified or improved based on the knowledge of those skilled in the art to which the present disclosure pertains.

REFERENCE SIGNS LIST

22: Measurement device, 30: Main body, 30*b*: Holding section, 32: Loading stand, 34: Stationary element, 36: Movable element, 40: Loading stand moving device, 41: Movable element moving device, 42: Electrical characteristic measurement section, 44: Component placement section, 60, 62: Air cylinder, 64, 66: Guide rail, 68, 69: Loading stand slider, 70, 71: Movable element slider, 64*b*, 68*b*, 69*b*, 70*b*, 71*b*: Bolt

The invention claimed is:

1. A measurement device configured to be mounted on a mounter for mounting a component supplied by a component supply device on a circuit board to measure an electrical characteristic of a component, the measurement device comprising:
 a main body, a loading stand on which a component is placed, a pair of measuring elements comprising a stationary element and a movable element, a loading stand moving device for moving the loading stand, and a movable element moving device for moving the movable element,
 wherein the movable element moving device includes a guide rail provided on the main body, and
 wherein a movable element holder for holding the movable element is held movably onto the guide rail.

2. The measurement device according to claim 1, wherein the guide rail is made of a metallic material.

3. The measurement device according to claim 1,
 wherein the loading stand moving device comprises a slider which is brought into movable engagement with the guide rail and one or more fastening members for fixing the loading stand to the slider, and
 wherein the slider and the one or more fastening members are both made of a metallic material.

4. The measurement device according to claim 1, comprising an electrical characteristic measurement section for measuring an electrical characteristic of the component in such a state that the component placed on the loading stand is gripped by the pair of measuring elements and that the loading stand is spaced apart from the component and the pair of measuring elements by the loading stand moving device.

\* \* \* \* \*